(12) United States Patent
Ma

(10) Patent No.: US 10,305,459 B2
(45) Date of Patent: May 28, 2019

(54) MULTI-PHASE CLOCK GENERATOR

(71) Applicant: Micron Technology, Inc., Boise, ID (US)

(72) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 24 days.

(21) Appl. No.: 15/622,739

(22) Filed: Jun. 14, 2017

(65) Prior Publication Data

US 2018/0367130 A1 Dec. 20, 2018

(51) Int. Cl.
| | | |
|---|---|---|
| *H03K 5/13* | (2014.01) | |
| *H03K 5/15* | (2006.01) | |
| *H03D 7/14* | (2006.01) | |
| *H03K 5/00* | (2006.01) | |

(52) U.S. Cl.
CPC ....... *H03K 5/15046* (2013.01); *H03D 7/1483* (2013.01); *H03K 2005/00058* (2013.01)

(58) Field of Classification Search
None
See application file for complete search history.

(56) References Cited

U.S. PATENT DOCUMENTS

| | | | |
|---|---|---|---|
| 8,018,265 B1 | 9/2011 | Kim et al. | |
| 8,717,081 B2 * | 5/2014 | Allott | H03K 5/15093 327/259 |
| 2003/0085746 A1 | 5/2003 | Tagami | |
| 2005/0040875 A1 | 2/2005 | Lee | |
| 2005/0189979 A1 | 9/2005 | Park | |
| 2011/0128061 A1 * | 6/2011 | Liu | H03K 5/13 327/298 |
| 2012/0092054 A1 * | 4/2012 | Chang | H02M 3/07 327/295 |
| 2013/0038370 A1 * | 2/2013 | Du | H03K 5/15093 327/298 |
| 2013/0043918 A1 * | 2/2013 | Ma | H03L 7/0812 327/158 |
| 2017/0149422 A1 | 5/2017 | Ma | |
| 2018/0062629 A1 * | 3/2018 | Ma | H03B 27/00 |

OTHER PUBLICATIONS

"International Application Serial No. PCT/US2018/037356, International Search Report dated Oct. 2, 2018", 3 pgs.
"International Application Serial No. PCT/US2018/037356, Written Opinion dated Oct. 2, 2018", 6 pgs.

* cited by examiner

*Primary Examiner* — Lincoln D Donovan
*Assistant Examiner* — Khareem E Almo
(74) *Attorney, Agent, or Firm* — Schwegman Lundberg & Woessner, P.A.

(57) ABSTRACT

Various embodiments include apparatus and methods that have a multiple phase generator. The multiple phase generator can include multiple delay devices coupled with a set of phase mixers having a specified mixing ratio to generate signals separated in phase by a constructed amount of phase based on the specified mixing ratio. Additional apparatus, systems, and methods are disclosed.

27 Claims, 13 Drawing Sheets

US 10,305,459 B2

MULTI-PHASE CLOCK GENERATOR

BACKGROUND

Conventional designs for multiple-phase generators use multiple adjustable delay lines or analog cells. These designs may use a locking process that is slow leading to an initialization time that is longer than desired. In addition, these designs may have power consumption higher than desired, at least partially due to the use of circuits to control the delay lines or analog cells. These power consumption properties may make it difficult for a power saving operation in idle mode, especially when conducting power down exit or standby across a number of operating conditions. A phase generator using a conventional ring oscillator may not be desirable. If no bias for voltage control is provided to a ring oscillator, the ring oscillator may be limited to a fixed frequency. If bias for voltage control is provided, the ring oscillator may be limited in operating range and have a long initialization that does not approach an instant on capability.

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, a multi-phase generator is provided that can operate at full frequency with respect to an input clock signal with instant on capability to provide multiple clocks, where each clock is at a different phase than the other clocks relative to a common period for the clocks. Each clock of the generated multiple clocks is offset in time from each respective other clocks by an integer multiple of the common period divided by the number of clocks comprising the multiple clocks. By instant on, it is meant that at least one clock phase of the multiple clocks is initiated within one clock cycle (period) of the input clock signal from which the multiple clocks are generated.

Multiple-phase generators, as taught herein, can provide ease of manufacturing that can avoid design challenges of conventional multiple-phase generators and can enable design flexibility of input/output (I/O) instant-on/off multi-phase power saving operations for a number of applications. Such multiple-phase generators may be implemented with a small foot print in a semiconductor die and without using circuitry to implement a locking time in the generation of multiple phased signals. For example, a triple-phase generator can be implemented for evolving triple data rate dynamic random-access memory (TDR-RAM) products as a next generation of products beyond double data rate random access memory (DDR-RAM). A triple-phase generator, as taught herein, may enable triple data rate (TDR) products to be ready for a next progressive speed upgrade beyond DDR-RAM with lower cost. Such triple-phase generators may be implemented to improve memory bandwidth over wide range of operating frequencies without tripling clock frequency, which can ease the manufacture process and reduce design challenges. A low power full frequency instant-on triple phase generator design solution may achieve a tight phase accuracy of about 7 ps to about 8 ps. Significant I/O bandwidth designs may be attained and potential memory bandwidth extension solutions may be enabled through TDR operations or tri-level signaling with the implementation of triple-phase generators, as taught herein.

Figure 1:
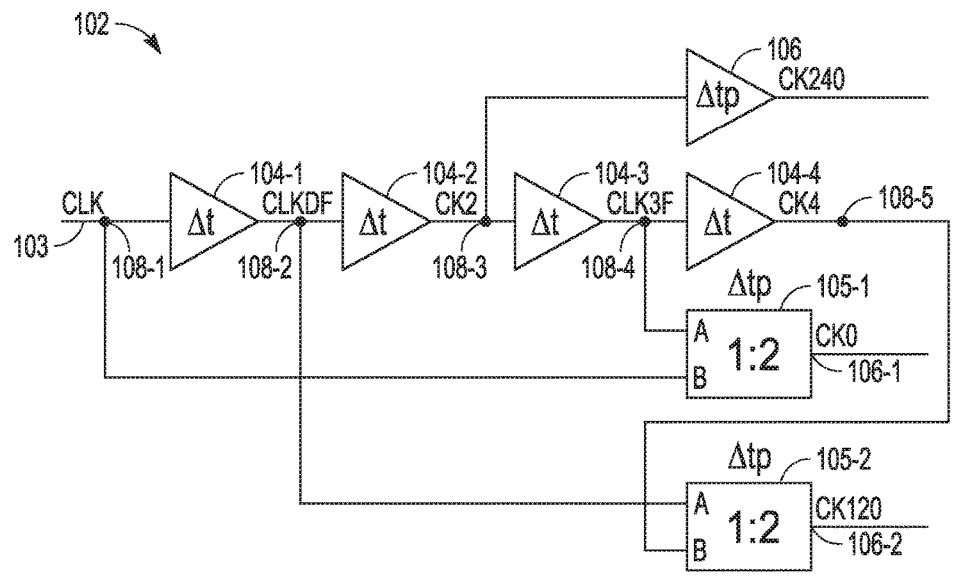
FIG. 1 is a block diagram of an example triple-phase generator, according to various embodiments.

FIG. 1 is a block diagram of an embodiment of an example triple-phase generator 102. Triple-phase generator 102 can be structured with an instant-on design architecture. Triple-phase generator 102 can generate three clocks in a triple-phase arrangement by phase mixing with proper ratio-delayed clock signals. Triple-phase generator 102 can comprise a clock input 103 to receive an input clock signal, CLK, having a period, and three outputs. 106-1, 106-2, and 106-3, to provide three clock signals, CK0, CK120, and CK240, respectively. Each clock signal of the three clock signals, CK0, CK120, and CK240, are separated in phase from another clock signal of the set of three clock signals by 120 (360/3) degrees, where each of the three clock signals can have a period equal to the period of the input clock signal. The architecture of triple-phase generator 102 includes multiple delay devices and phase mixers coupled without feedback in an open loop style.

Triple-phase generator 102 can include multiple delay devices coupled together, where a delay device of the multiple delay devices is coupled to the clock input 103 to receive the input clock signal, CLK. The multiple delay devices can include a first delay device 104-1, a second delay device 104-2, a third device delay 104-3, and a fourth delay device 104-4 in a serial chain from the first delay device 104-1 coupled to the input clock signal, CLK, with the fourth delay device 104-4 at the end of the serial chain using nodes 108-1, 108-2, 108-3, 108-4, and 108-5. The delay devices are arranged in a serial chain in that the output of one of the delay devices is coupled to an input of the next delay device in the chain. Each of the delay devices 104-1, 104-2, 104-3, and 104-4 can provide a common amount of delay, Δt. The common amount of delay, Δt, can be greater than or equal to one-fifth of a minimum period of the input clock signal and less than the minimum period of the input clock signal. The minimum period being a parameter of the device for which the clock is used.

Triple-phase generator 102 can include a set of phase mixers, 105-1 and 105-2. Each phase mixer 105-1 and 105-2 has a mixing ratio of 1 to 2 and a common delay, Δtp. As is known by one skilled in the art, a phase mixer, having a mixing ratio of M:N, can provide a signal by mixing two input signals such that one of the two input signals is provided with a strength of N/M relative to the other input signal. Phase mixers 105-1 and 105-2 have an A input and a B input, where a signal received at the B input is provided with twice the strength of a signal at the A input.

Phase mixer 105-1 has inputs to receive the input clock signal, CLK, and a delayed input clock signal from an output of delay device 104-3. The input of first phase mixer 105-1 can be coupled to receive the clock signal, CLK, at the B input of first phase mixer 105-1 correlated to 2 in the mixing ratio of first phase mixer 105-1. The other phase mixer, phase mixer 105-2, has inputs coupled to receive different delayed input clock signals from outputs of different ones of the multiple delay devices. The phase mixers can be coupled to outputs of the multiple delay devices based on the mixing ratio and a phase of the three clock signals to be operatively output from the respective phase mixer. The first phase mixer 105-1 has an output to provide a clock of zero phase of the three clock signals.

Second phase mixer 105-2 has an input coupled to an output of the first delay device 104-1 of the serial chain and an input coupled to an output of the fourth delay device 104-4 of the serial chain. Second phase mixer 105-2 has an output to provide a clock of 120 degree phase of the three clock signals. The input of second phase mixer 105-2 can be coupled to the output of the fourth delay device 104-4 at the B input of second phase mixer 105-2 correlated to 2 in the mixing ratio of second phase mixer 105-2.

A fifth delay device 106 of the multiple delay devices can provide an amount of delay equal to a common amount of delay, Δtp, of the first and second phase mixers, 105-1 and 105-2. The fifth delay device 106 has an input coupled to an output of the second delay device 104-2 of the serial chain and having an output to provide a clock of 240 degree phase of the three clock signals at output 106-3 of triple-phase generator 102.

Delay devices 104-1, 104-2, 104-3, 104-4, and 106 can be structured as inverters. With CLK input to inverter 104-1, the output of inverter 104-1 is the complement of CLK, which can be referred to as CLKDF, with a Δt delay. A complement of a clock signal is the clock signal shifted by 180°. With CLK input to inverter 104-1, the output of inverter 104-2 is CLK2, which is essentially CLK with a 2*Δt delay (the symbol * refers to the multiplication operator). With CLK input to inverter 104-1, the output of inverter 104-3 is the complement of CLK, which can be referred to here as CLK3F, with a 3*Δt delay. With CLK input to inverter 104-1, the output of inverter 104-4 is CLK4, which is essentially CLK with a 4*Δt delay. CLKDF, CLK2, CLK3F, and CLK4 can be generated at full frequency with respect to CLK, without using circuitry to divide CLK.

Figure 2:
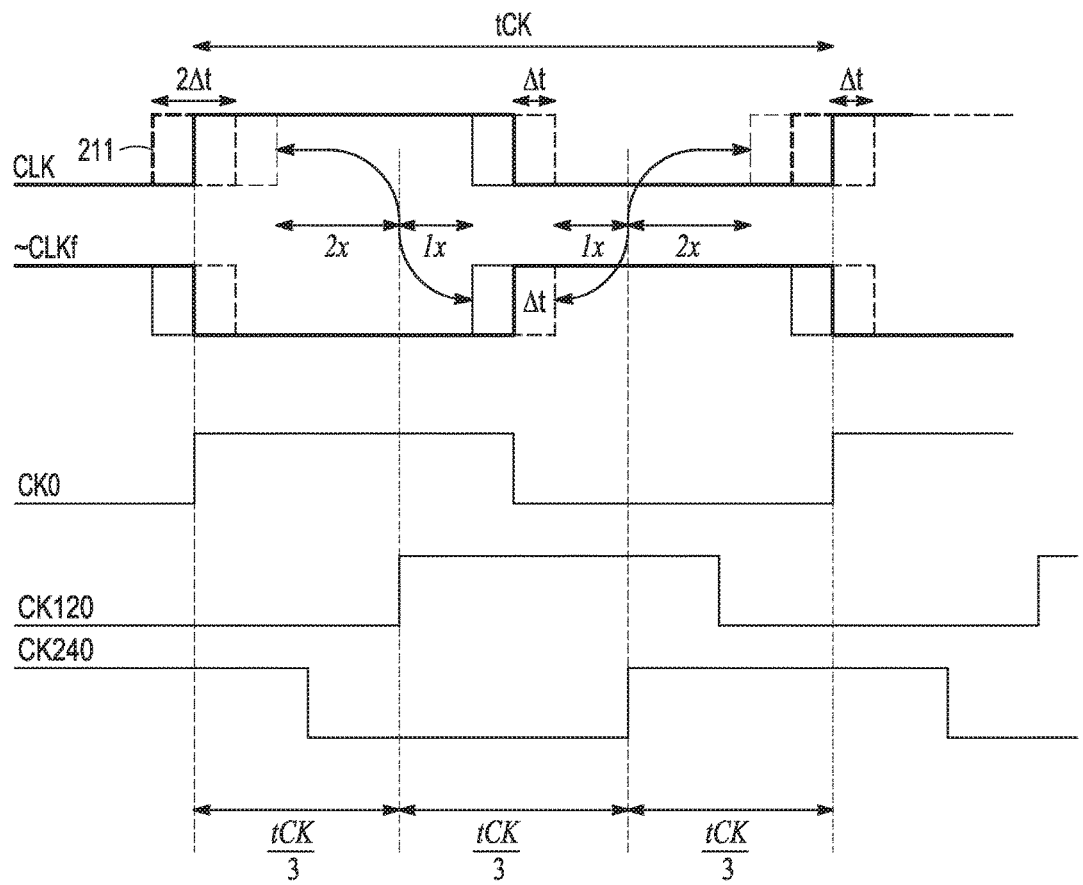
FIG. 2 is an illustration of waveforms from operating the example triple-phase generator of FIG. 1, according to various embodiments.

FIG. 2 is an illustration of waveforms from operating the example triple-phase generator 102 of FIG. 1. This illustration provides an example of instant-on timing of the generated three signals CK0, CK120, and CK240, where these clocks begin within a period of the CLK. With the delay devices 104-1, 104-2, 104-3, 104-4, and 106 being inverters, the signals input to the first phase mixer 105-1 are CLK and its complement with various delays. With CLK having a period of tCK, the input signals to phase mixers 105-1 and 105-2 have a period of tCK and the mixing ratio of 1:2 can be used to provide CK0, CK120, and CK240 to have a phase of tCK/3 relative to each other. As shown in FIG. 2, with the first phase mixer 105-1 having a mixing ratio of 1:2, one of the inputs has a strength that pulls the pulse edge with a strength of 2× with the other input having an opposite strength of 1×, while maintaining the tCK period. The output of first phase mixer 105-1, which is CK0, has a positive going edge that is shifted by Δt from the positive going edge 211 of CLK. CK240 is generated using the delays Δt and Δtp.

Figure 3:
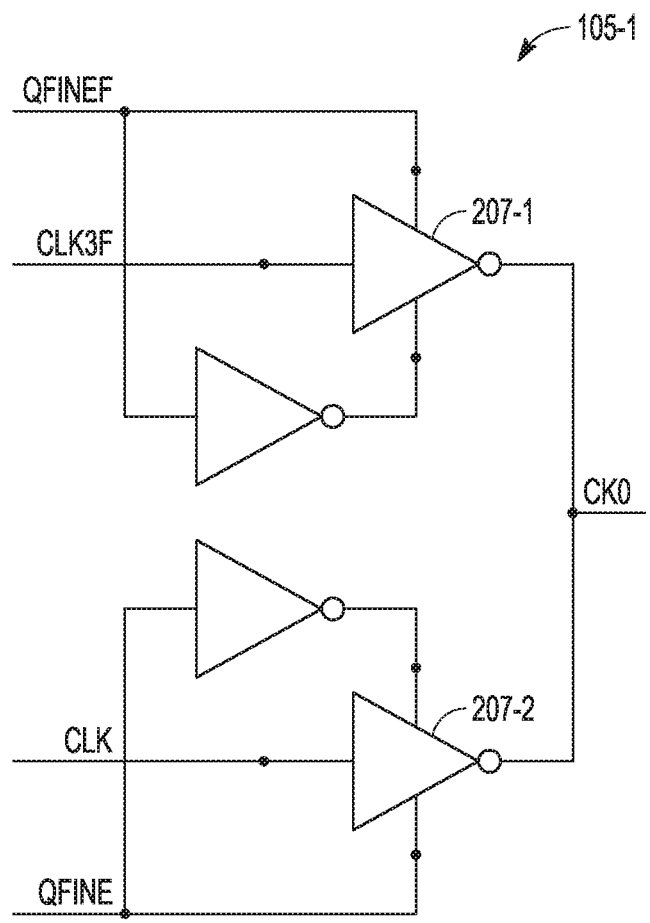
FIG. 3 shows an example phase mixer that can be used in FIG. 1, according to various embodiments.

FIG. 3 shows an embodiment of an example 2:1 phase mixer 105-1 that can be used in FIG. 1. Along with inputs for CLK3F and CLF to generate CL0, phase mixer 105-1 can include controllable inverters 207-1 and 207-2. Controllable inverters 207-1 and 207-2 can be controlled by control signal QFINE and the complement of QFINE, referenced as QFINEF. Phase mixer 105-1 can be structured to receive control signals QFINE and QFINEF as digital control signals. Alternatively, phase mixer 105-1 can be structured to receive an analog control signal QFINE and control signal QFINEF that is at 180° to QFINE.

Figure 4:
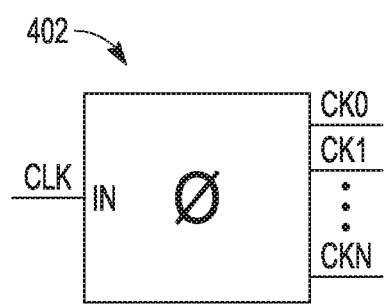
FIG. 4 is a representation of a multiple phase generator, according to various embodiments.

FIG. 4 is a representation of a multiple phase generator 402. Multiple phase generator 402 has an input to receive an input clock signal and N outputs to output a set of N clock signals with N being a positive integer, where each clock signal is separated in phase from another clock signal of the set of N clock signals by 360/N degrees. Multiple phase generator 402 can be implemented by phase mixing with properly ratio-delayed clock signals. Multiple delay devices can be coupled together and arranged with a set of phase mixers, where each phase mixer has a mixing ratio of 1 to (N−1). A phase mixer of the set can have an input to receive the input clock signal and an input to receive a delayed input clock signal from an output of a delay device of the multiple delay devices. Each of the other phase mixers can have inputs coupled to receive different delayed input clock signals from outputs of different ones of the multiple delay devices. Coupling of the phase mixers to outputs of the multiple delay devices can be based on the mixing ratio and a phase of the N clock signals operatively output from the respective phase mixer.

The multiple delay devices can include a number of the multiple delay devices providing a common amount of delay with one delay device of the multiple delay devices providing an amount of delay equal to a common amount of delay of the phase mixers. The clock signal having a phase of (N−1)*360/N can be operatively output from the delay device that provides the amount of delay equal to the common amount of delay of the phase mixers. A number of the multiple delay devices can provide a common amount of delay that is greater than or equal to one-fifth of a minimum period of the input clock signal and less than the minimum period of the input clock signal.

Figure 5:
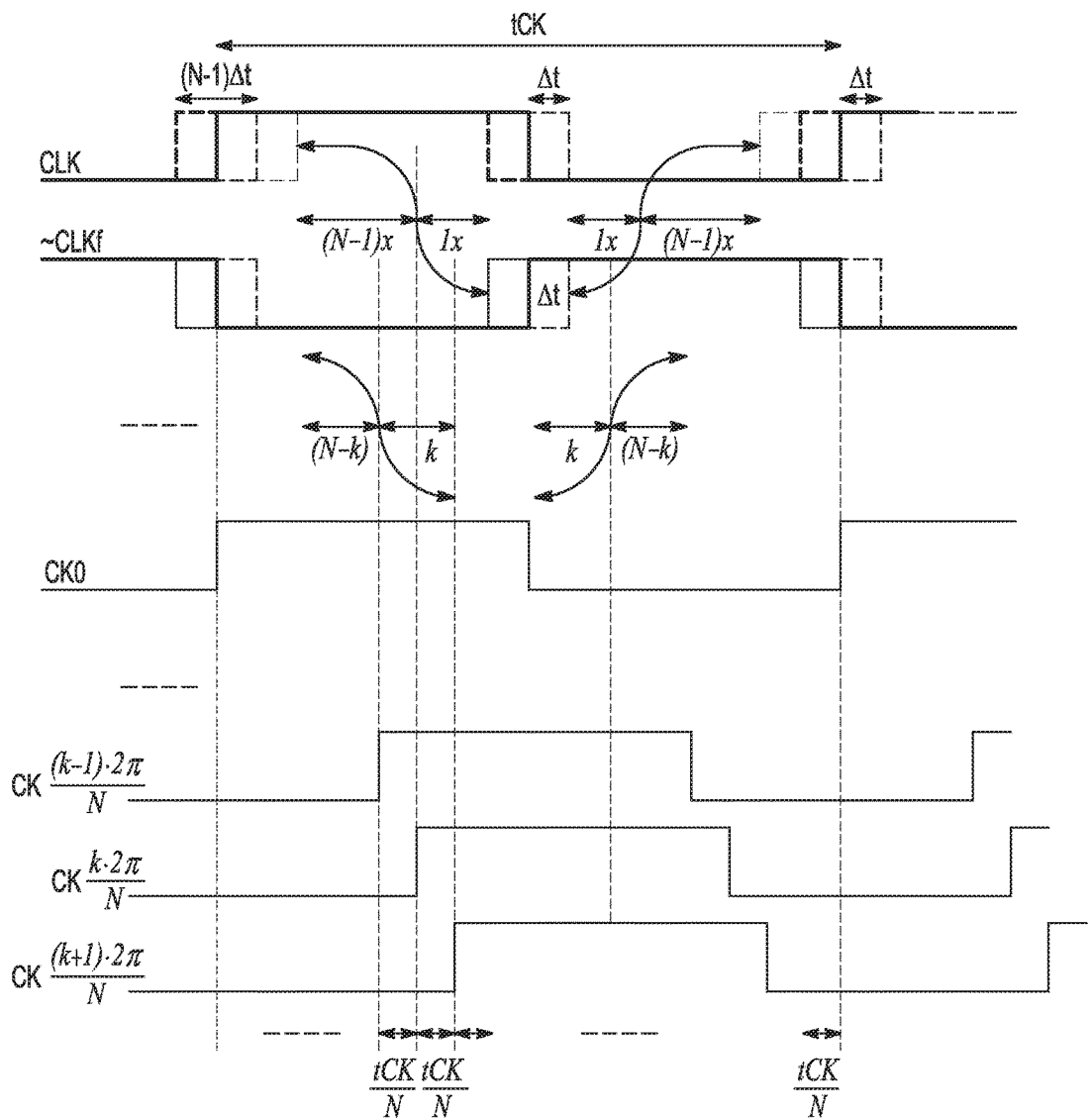
FIG. 5 is an illustration of waveforms from operating the example multiple phase generator of FIG. 4, according to various embodiments.

FIG. 5 is an illustration of waveforms from operating the example N-phase generator 402 of FIG. 1. This illustration provides an example of instant-on timing of the generated signals CK0 . . . CK (k−1)*2π/N, CK k*2π/N, CK (k+1)*2π/N . . . and CK (N−1)*2π/N, where these clocks begin within a period, tCK, of the CLK. With the multiple delay devices being inverters, the signals input to the set of phase mixers are CLK and its complement with various delays. With CLK having a period of tCK, the input signals to the set of phase mixers have a period of tCK and the mixing ratio of 1:N can be used to provide clocks with a phase of tCK/N relative to each other. As shown in FIG. 5, for the set of phase mixers having a mixing ratio of 1:N, one of the inputs has a strength that pulls the pulse edge with a strength of (N−k) with the other input having an opposite strength of k, while maintaining the tCK period. CK (N−1)*2π/N can be generated using the delays of the inverters and the delay of the set of phase mixers.

Figure 6:
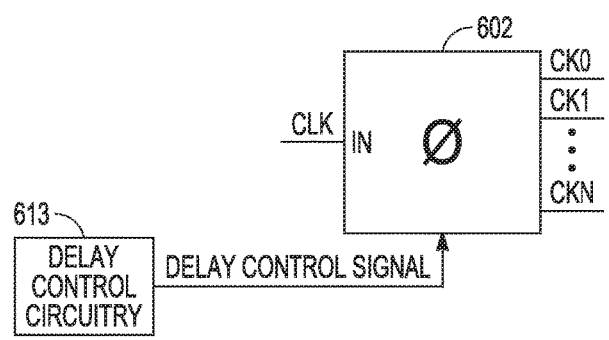
FIG. 6 is a representation of a multiple phase generator having an input coupled to delay control circuitry to receive a delay control signal, according to various embodiments.

FIG. 6 is a representation of a multiple phase generator 602 having an input coupled to delay control circuitry 613 to receive a delay control signal. Multiple phase generator 602 can be implemented similar to multiple phase generator 402 of FIG. 4. Multiple phase generator 602 has an input to receive an input clock signal and N outputs to output a set of N clock signals with N being a positive integer, where each clock signal is separated in phase from another clock signal of the set of N clock signals by 360/N degrees. Multiple phase generator 602 can be implemented by phase mixing with properly ratio-delayed clock signals. Multiple delay devices can be coupled together and arranged with a set of phase mixers, where each phase mixer has a mixing ratio of 1 to (N−1). The delay control signal can be used by multiple phase generator 602 to adjust an amount of delay that is common to each of a number of the multiple delay devices of multiple phase generator 602 and adjust an amount of delay that is common to each of the phase mixers of multiple phase generator 602, where the amount of delay for these devices is adjusted adaptively based on a frequency range of the input clock signal.

Delay control circuitry may include frequency detection to identify a frequency of the input clock signal as being in one of three frequency ranges and generate the delay control signal based on the identified frequency. The three frequency ranges can correspond to a high frequency range, middle frequency range, or low frequency range, for example, a high speed can correspond to a range including 500 picoseconds, a middle range can include millisecond, and a slow frequency can include periods that are longer than a millisecond. Delay control circuitry may include a mode register to store data to generate the delay control signal. The delay control signal can be a digital signal. Alternatively, the delay control signal can be an analog signal.

Multiple phase generator 102 of FIG. 1, multiple phase generator 402 of FIG. 4, or multiple phase generator 602 of FIG. 6 can be integrated in a processor integrated circuit. Multiple phase generator 102 of FIG. 1, multiple phase generator 402 of FIG. 4, or multiple phase generator 602 of FIG. 602 can be integrated in a memory integrated circuit. Multiple phase generator 102, multiple phase generator 402, or multiple phase generator 602 can be integrated in other electronic devices that make use of multiple clock signals that are in a phase relationship with each other. Such a multiple phase generator may be realized as an integrated circuit that is connected to other integrated circuits that use the signals generated by the multiple phase generator.

Figure 7:
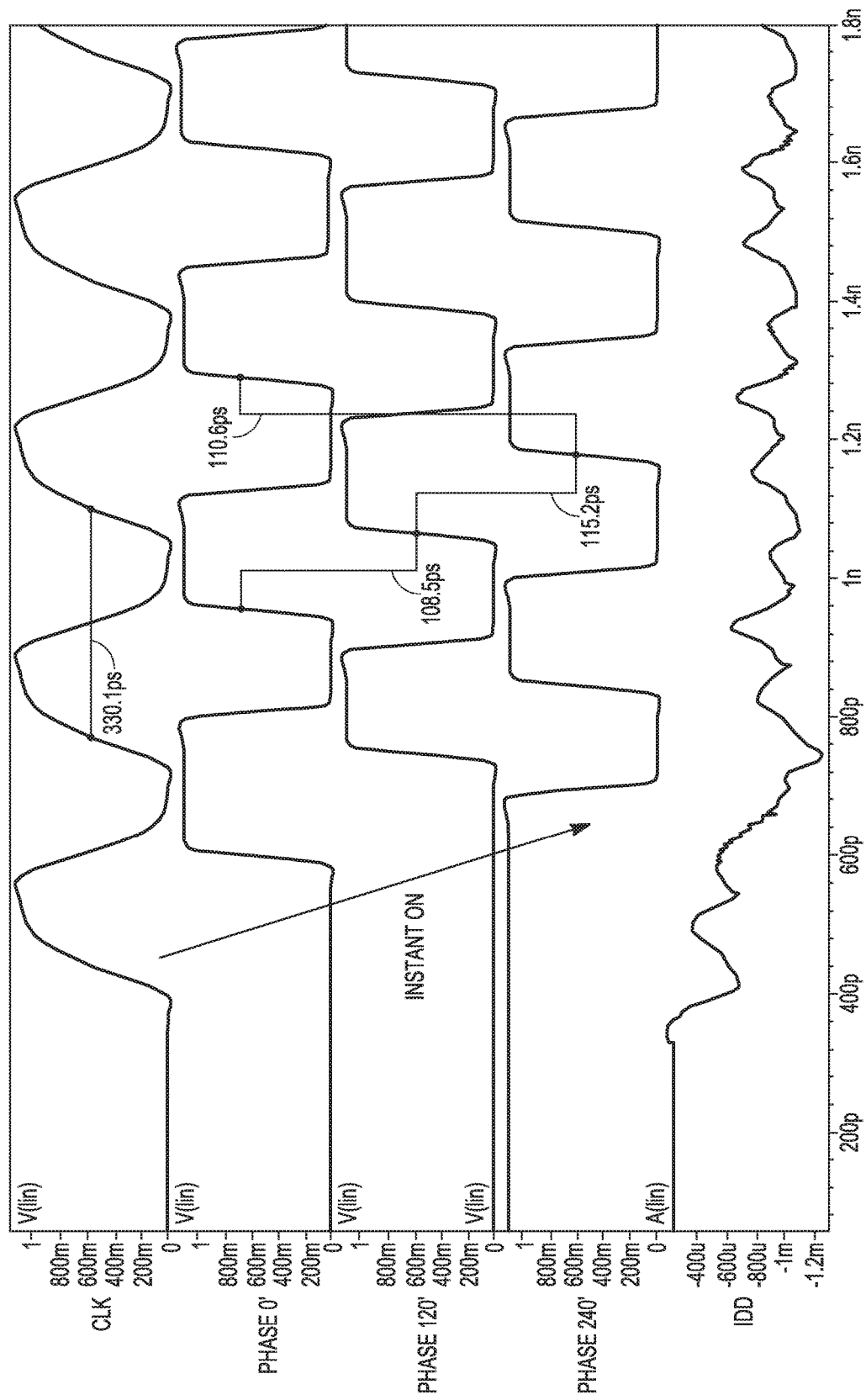
FIGS. 7-13 are waveforms of example simulations using the triple-phase generator of FIG. 1, according to various embodiments.

FIGS. 7-13 are waveforms of example simulations using the triple-phase generator of FIG. 1. FIG. 7 is a simulation with the triple-phase generator with an input CLK having a period of 330 ps, which has an average drain current of 895.4 μA at 1.1 V at 90° C. The corresponding ideal phase interval for the signals output from the triple-phase generator is 110 ps. The phase difference between phase 0 and phase 120 is 108.5 ps. The phase difference between phase 120 and phase 240 is 115.2 ps. The phase difference between phase 240 and phase 0 is 110.6 ps. The signals have a maximum phase error equal to ±5.2 ps.

Figure 8:
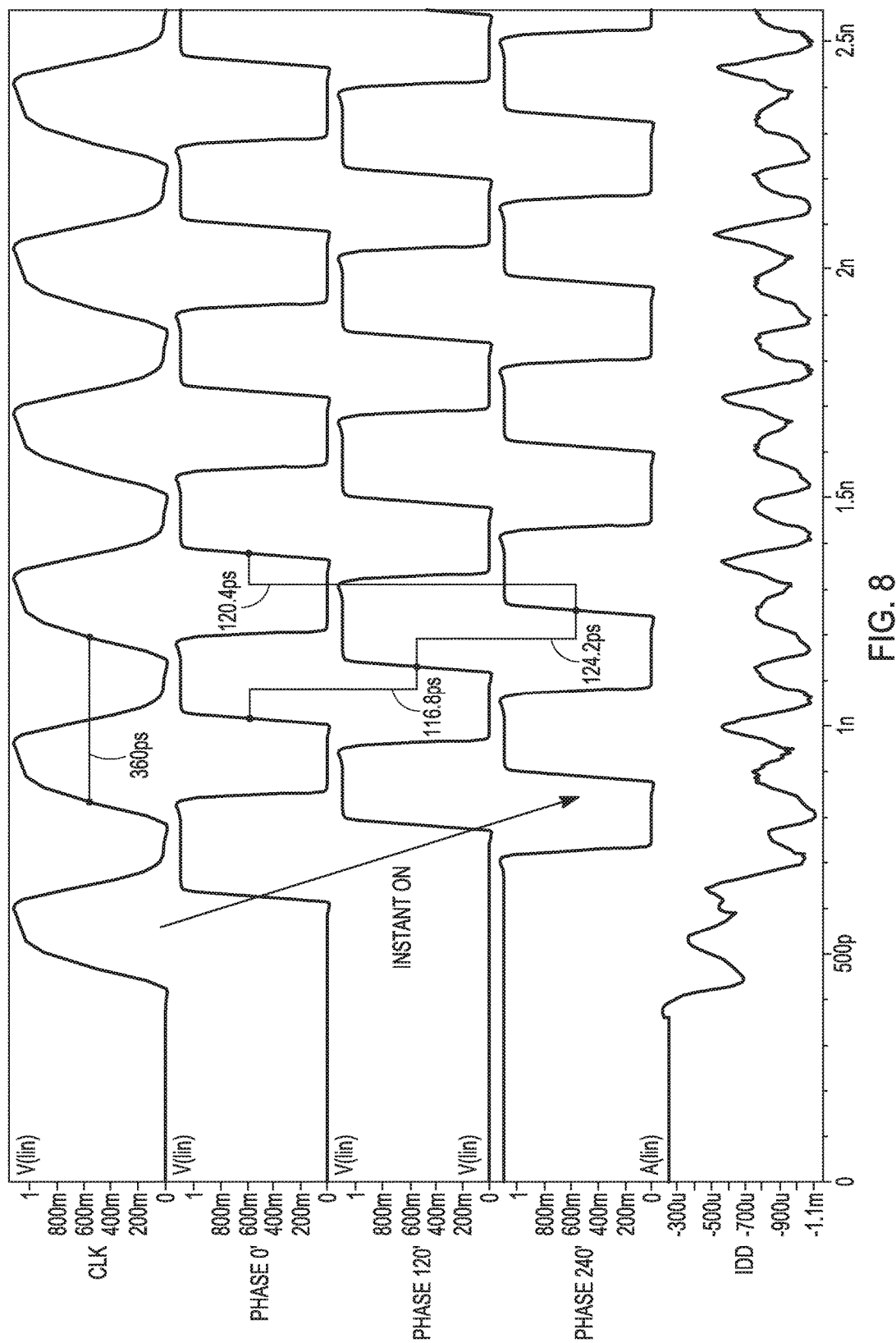

FIG. 8 is a simulation with the triple-phase generator with an input CLK having a period of 360 ps, which has an average drain current of 834.4 μA at 1.1 V at 90° C. The corresponding ideal phase interval for the signals output from the triple-phase generator is 120 ps. The phase difference between phase 0 and phase 120 is 116.8 ps. The phase difference between phase 120 and phase 240 is 124.2 ps. The phase difference between phase 240 and phase 0 is 120.4 ps. The signals have a maximum phase error equal to ±4.2 ps.

Figure 9:
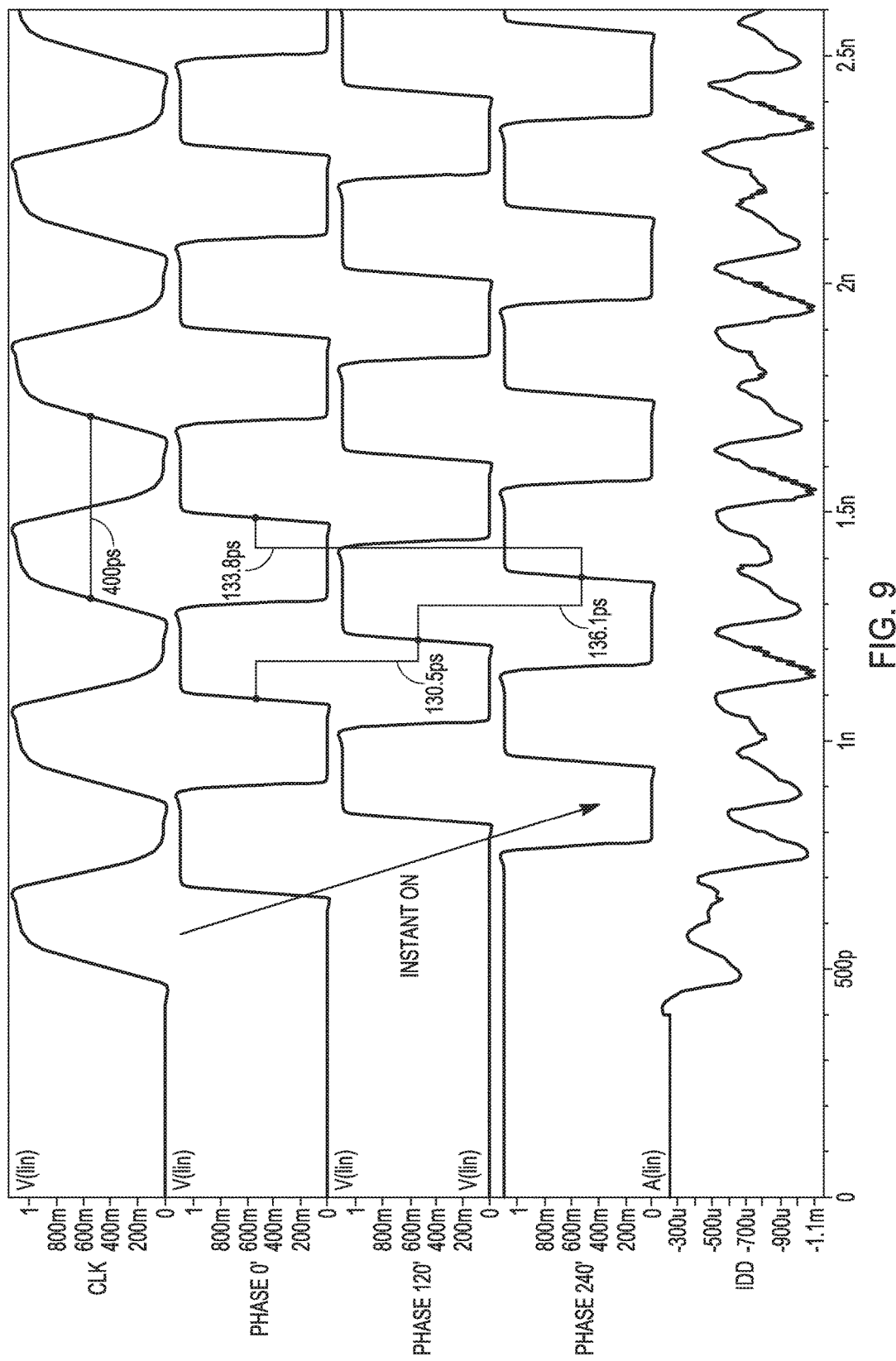

FIG. 9 is a simulation with the triple-phase generator with an input CLK having a period of 400 ps, which has an average drain current of 771.7 μA at 1.1 V at 90° C. The corresponding ideal phase interval for the signals output from the triple-phase generator is 133.3 ps. The phase difference between phase 0 and phase 120 is 130.5 ps. The phase difference between phase 120 and phase 240 is 136.1 ps. The phase difference between phase 240 and phase 0 is 133.8 ps. The signals have a maximum phase error equal to ±2.8 ps.

Figure 10:
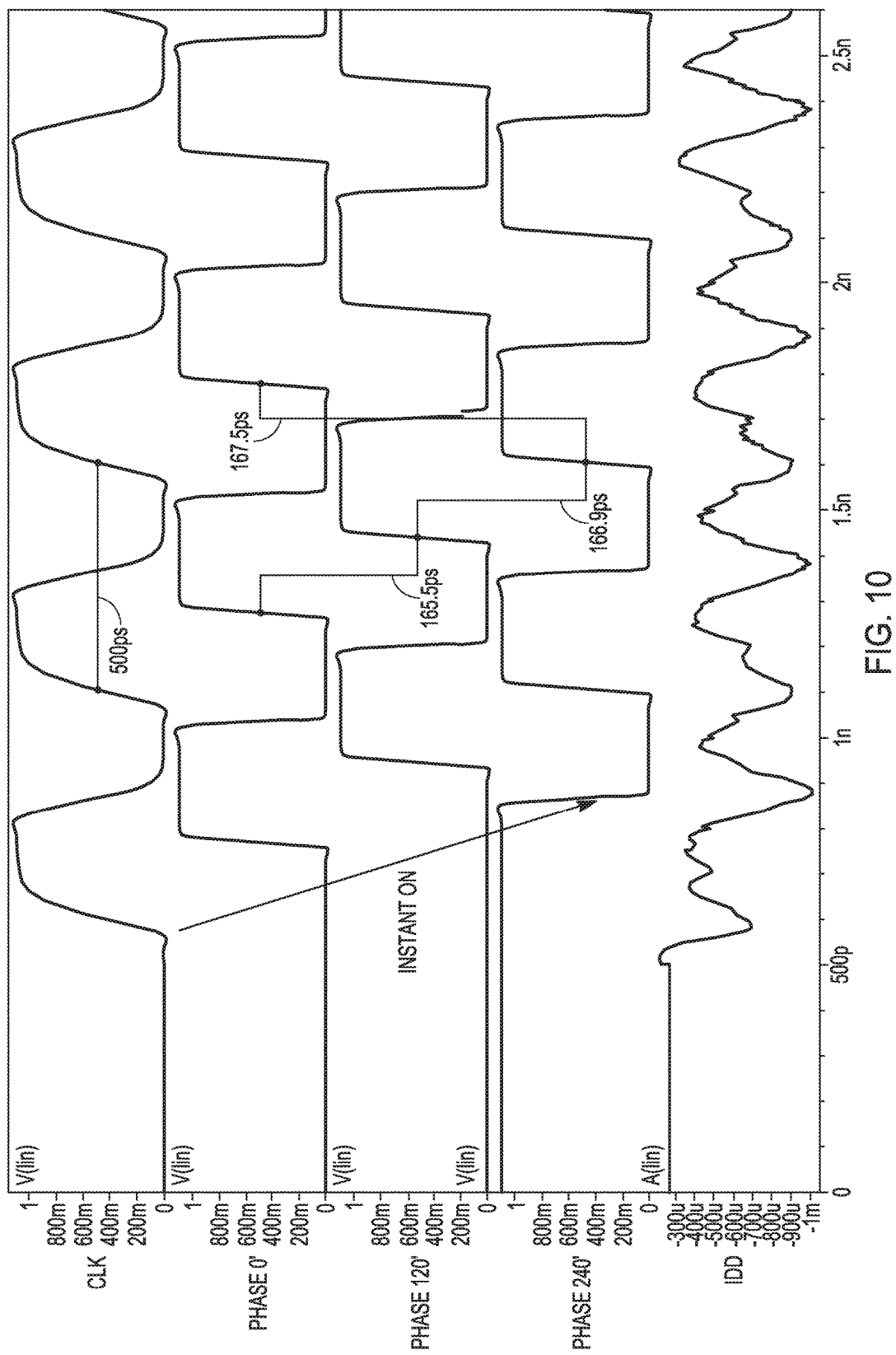

FIG. 10 is a simulation with the triple-phase generator with an input CLK having a period of 500 ps, which has an average drain current of 636.6 μA at 1.1 V at 90° C. The corresponding ideal phase interval for the signals output from the triple-phase generator is 166.6 ps. The phase difference between phase 0 and phase 120 is 165.6 ps. The phase difference between phase 120 and phase 240 is 166.9 ps. The phase difference between phase 240 and phase 0 is 167.5 ps. The signals have a maximum phase error equal to ±1.0 ps.

Figure 11:
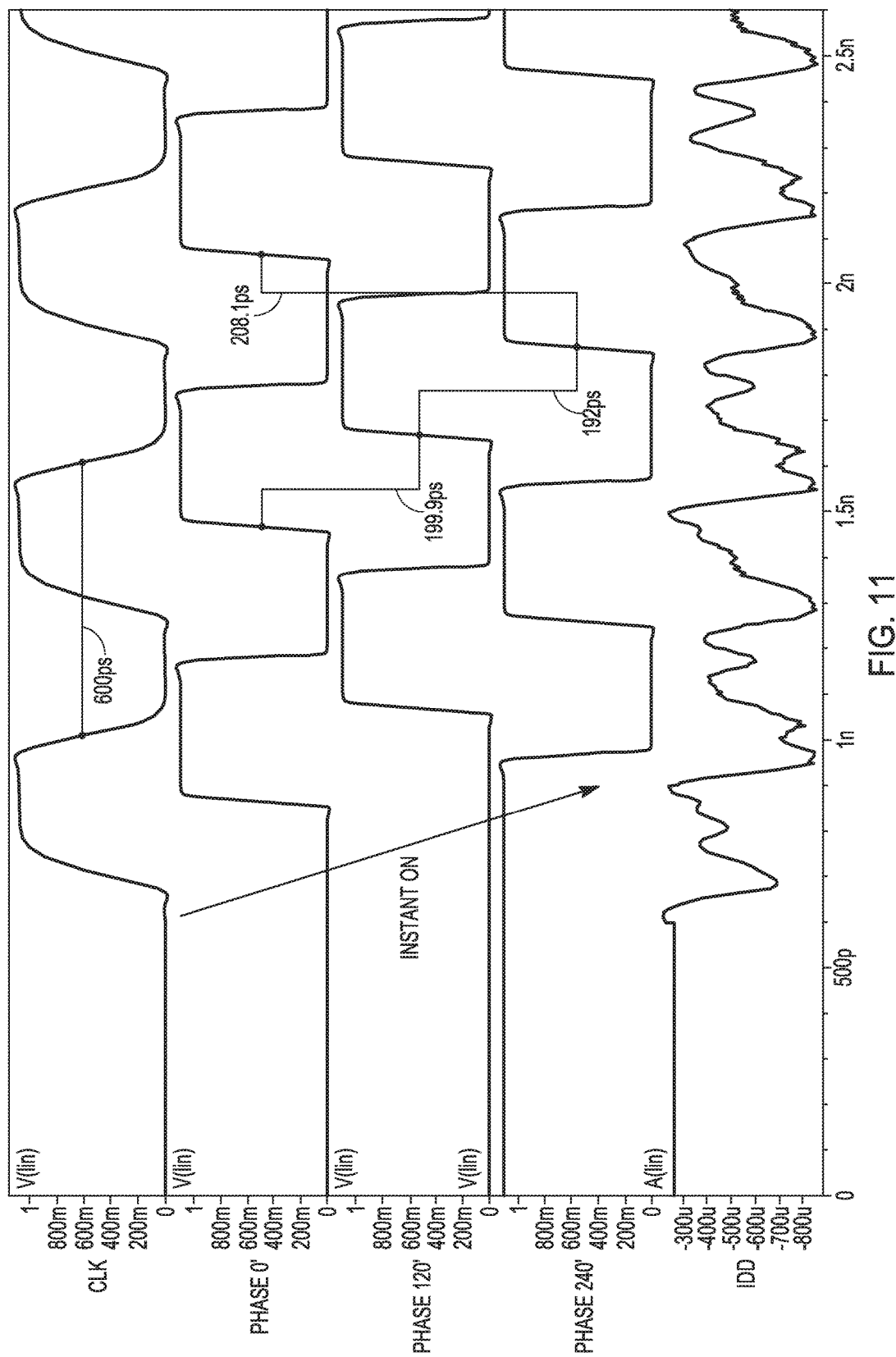

FIG. 11 is a simulation with the triple-phase generator with an input CLK having a period of 600 ps, which has an average drain current of 569.9 μA at 1.1 V at 90° C. The corresponding ideal phase interval for the signals output from the triple-phase generator is 200 ps. The phase difference between phase 0 and phase 120 is 199.9 ps. The phase difference between phase 120 and phase 240 is 192 ps. The phase difference between phase 240 and phase 0 is 208.1 ps. The signals have a maximum phase error equal to ±8.1 ps.

Figure 12:
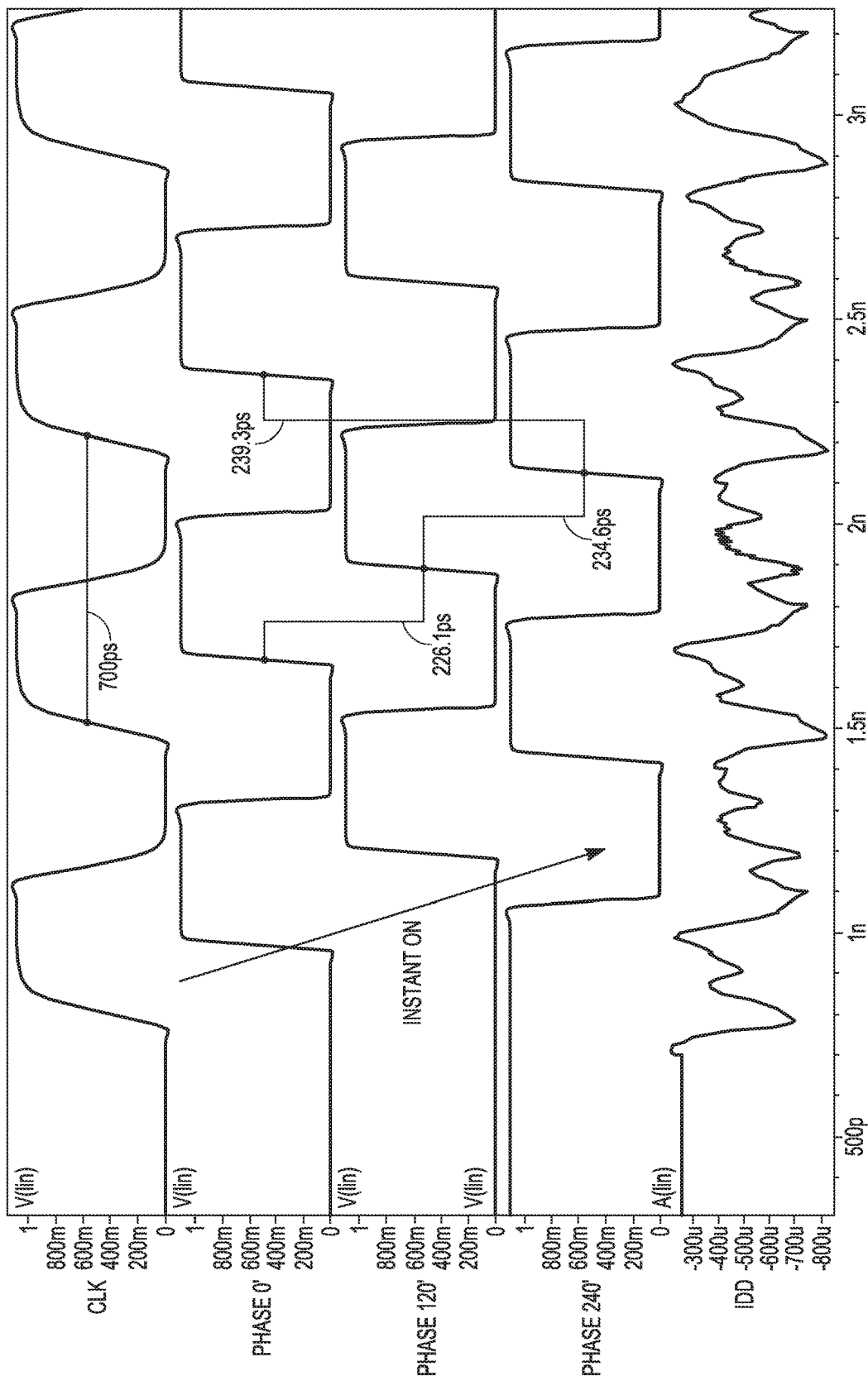

FIG. 12 is a simulation with the triple-phase generator with an input CLK having a period of 700 ps, which has an average drain current of 519.6 μA at 1.1 V at 90° C. The corresponding ideal phase interval for the signals output from the triple-phase generator is 233.3 ps. The phase difference between phase 0 and phase 120 is 226.1 ps. The phase difference between phase 120 and phase 240 is 234.6 ps. The phase difference between phase 240 and phase 0 is 239.3 ps. The signals have a maximum phase error equal to ±7.2 ps.

Figure 13:
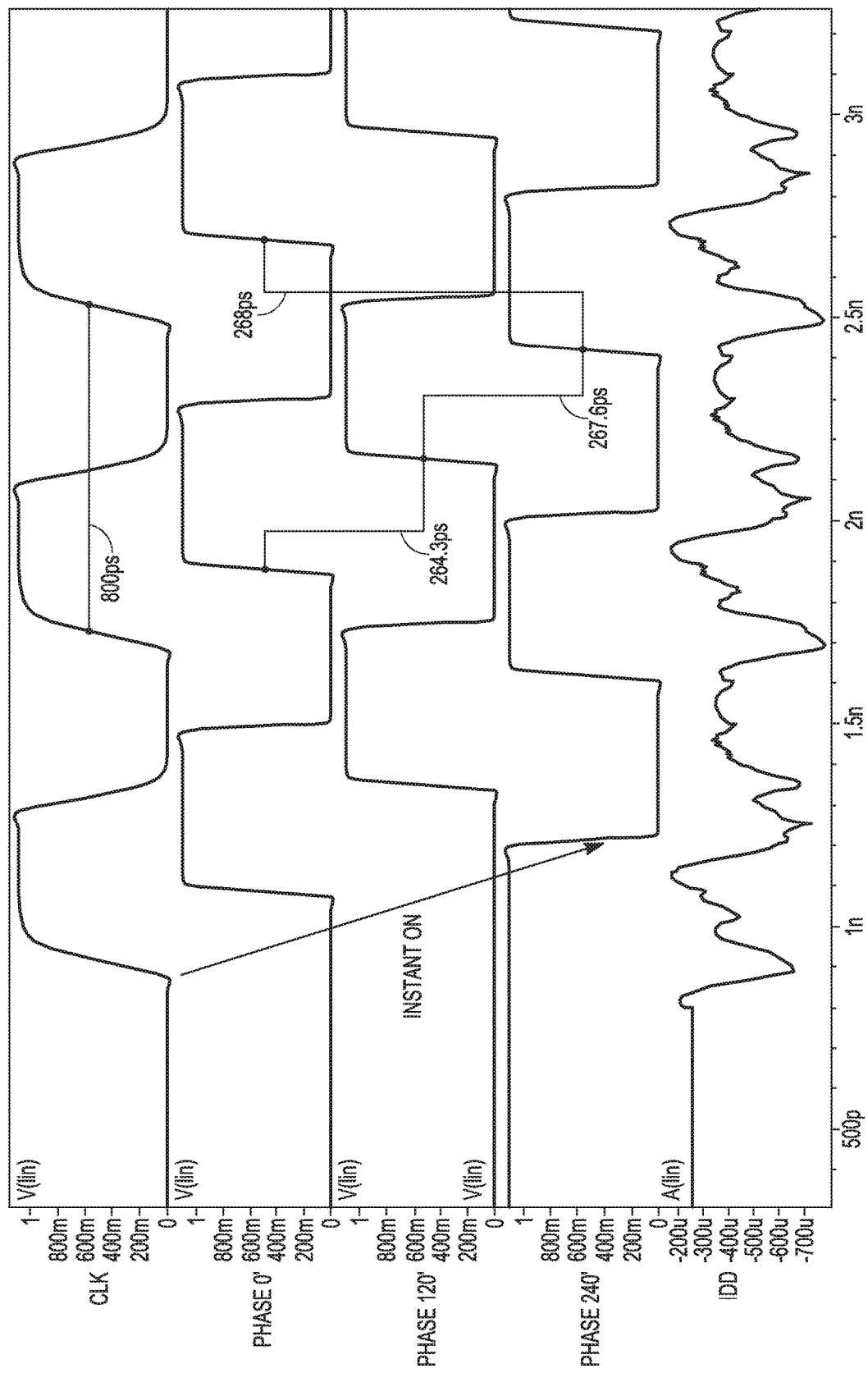

FIG. 13 is a simulation with the triple-phase generator with an input CLK having a period of 800 ps, which has an average drain current of 478.5 μA at 1.1 V at 90° C. The corresponding ideal phase interval for the signals output from the triple-phase generator is 266.6 ps. The phase difference between phase 0 and phase 120 is 264.3 ps. The phase difference between phase 120 and phase 240 is 267.6 ps. The phase difference between phase 240 and phase 0 is 268 ps. The signals have a maximum phase error equal to ±2.3 ps.

Figure 14:
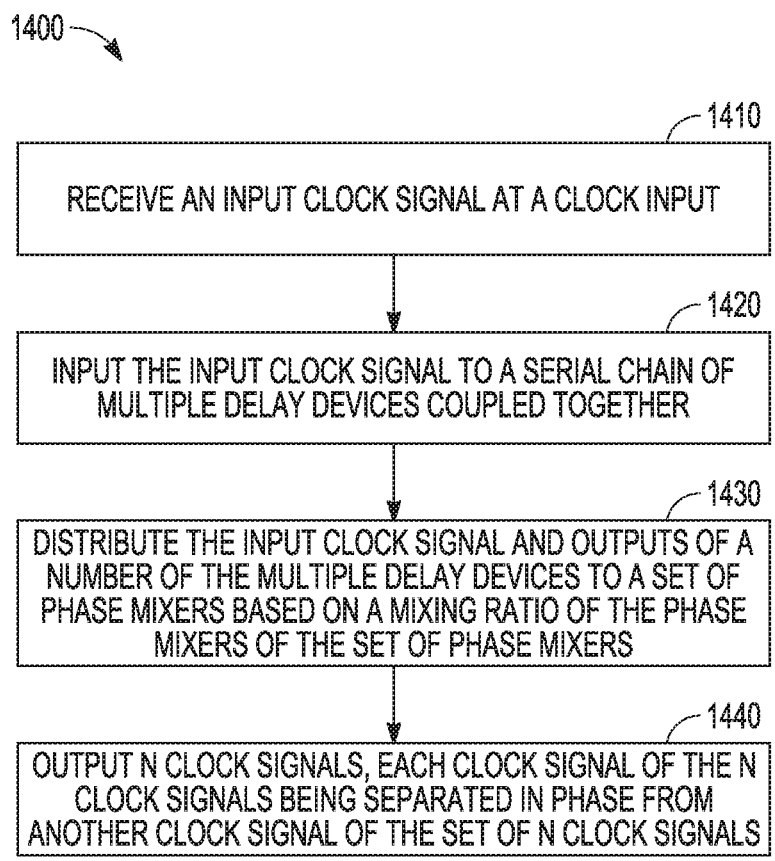
FIG. 14 is a flow diagram of features of an example method to generate multiple phases, according to various embodiments.

FIG. 14 is a block diagram of features of an embodiment of an example method to generate multiple phases. At 1410, an input clock signal is received at a clock input of a N-phase generator, where the input clock signal has a period. At 1420, the input clock signal is input to a serial chain of multiple delay devices coupled together. A first delay device of the multiple delay devices can be arranged to receive the input clock signal. At 1430, the input clock signal and outputs of a number of the multiple delay devices are distributed to a set of phase mixers based on a mixing ratio of the phase mixers of the set of phase mixers. Each phase mixer can have a mixing ratio of 1 to (N−1) with N being a positive integer equal to or greater than three. In various embodiments, N equals 3.

At 1440, N clock signals are output, where each clock signal of the N clock signals is separated in phase from another clock signal of the set of N clock signals. The set of N clock signals can be separated in phase by 360/N degrees. Each of the N clock signals can have a period equal to the period of the input clock signal. A number of the N clock signals can be provided from outputs of the set of phase mixers.

Variations of method 1400 or methods similar to method 1400 can include a number of different embodiments that may or may not be combined depending on the application of such methods and/or the architecture of systems in which such methods are implemented. Such methods can include providing a delay control signal to adjust an amount of delay that is common to each of a number of the multiple delay devices, where the amount of delay can be adjusted adaptively based on a frequency range of the input clock signal. A delay control signal can be provided to adjust an amount of delay that is common to each of a number of the phase mixers, where the amount of delay can be adjusted adaptively based on a frequency range of the input clock signal. Providing the delay control signal can include providing an analog control signal. Alternatively or in combination, providing the delay control signal can include providing a digital control signal.

Figure 15:
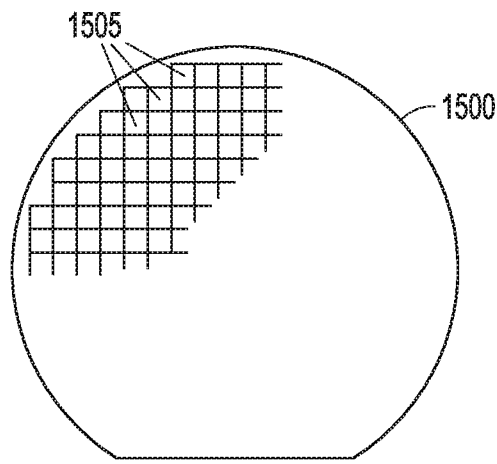
FIG. 15 illustrates an example of a wafer arranged to provide multiple electronic components, according to various embodiments.

FIG. 15 illustrates an embodiment of an example of a wafer 1500 arranged to provide multiple electronic components. Wafer 1500 can be provided as a wafer in which a number of dice 1505 can be fabricated. Alternatively, wafer 1500 can be provided as a wafer in which the number of dice 1505 have been processed to provide electronic functionality and are awaiting singulation from wafer 1500 for packaging. Wafer 1500 can be provided as a semiconductor wafer, a semiconductor on insulator wafer, or other appropriate wafer for processing electronic devices such as an integrated circuit chips.

Using various masking and processing techniques, each die 1505 can be processed to include functional circuitry such that each die 1505 is fabricated as an integrated circuit with the same functionality and packaged structure as the other dice on wafer 1500. Alternatively, using various masking and processing techniques, various sets of dice 1505 can be processed to include functional circuitry such that not all of the dice 1505 are fabricated as an integrated circuit with the same functionality and packaged structure as the other dice on wafer 1500. A packaged die having circuits integrated thereon providing electronic capabilities is herein referred to as an integrated circuit (IC).

Wafer 1500 can comprise multiple dice 1505. Each die 1505 of the multiple dice can be structured with an N-phase generator. The N-phase generator can include multiple delay devices coupled with a set of phase mixers having a specified ratio. The N-phase generator may be structured similar or identical to N-phase generators associated with any of FIGS. 1, 2, and 4-6.

Figure 16:
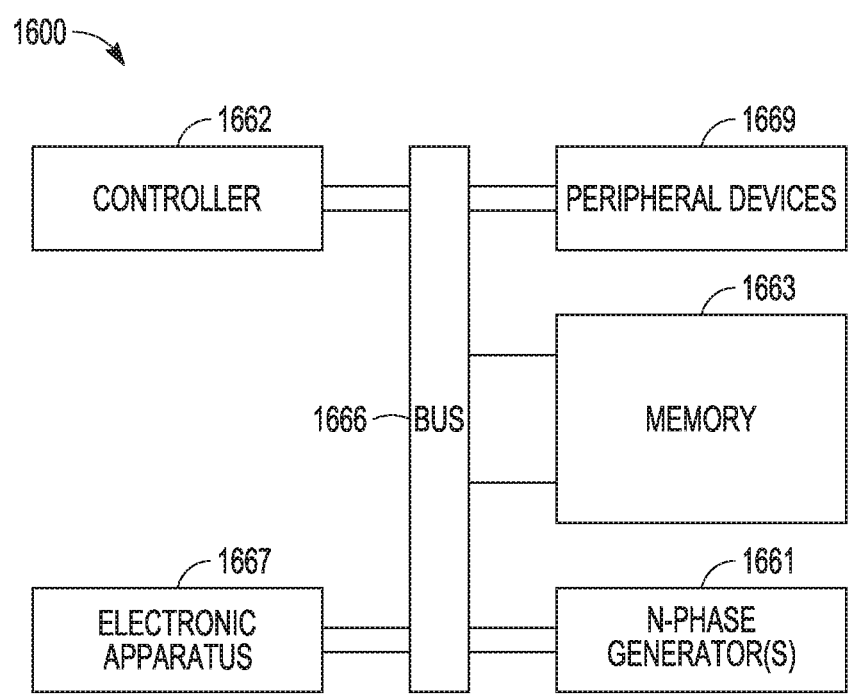
FIG. 16 shows a block diagram of an example system that includes a N-phase generator, according to various embodiments.

FIG. 16 shows a block diagram of an embodiment of an example system 1600 that includes one or more N-phase generators 1661. N-phase generators 1661 can be structured as taught herein and can provide multiple signals, separated in phase by a constructed amount, to one or more components of system 1600. System 1600 can include a controller 1662 operatively coupled to memory 1663. System 1600 can also include an electronic apparatus 1667 and peripheral devices 1669. Electronic apparatus 1667 can include delay control circuitry to generate a delay control signal to adjust an amount of delay for multiple delay devices and/or an amount of delay for phase mixers of N-phase generators 1661. Electronic apparatus 1667 can include frequency detection to identify a frequency of the input clock signal as being in one of three frequency ranges and generate the delay control signal based on the identified frequency. The three frequency ranges can be arranged as low, medium, and high. One or more of controller 1662, memory 1663, electronic apparatus 1667, or peripheral devices 1669 can be in the form of one or more ICs.

A bus 1666 provides electrical conductivity between and/or among various components of system 1600. In an embodiment, bus 1666 can include an address bus, a data bus, and a control bus, each independently configured. In an alternative embodiment, bus 1666 can use common conductive lines for providing one or more of address, data, or control, the use of which is regulated by controller 1662. Controller 1662 can be in the form or one or more processors.

Electronic apparatus 1667 may include additional memory. Memory in system 1600 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory. Memory 1663 can include mode registers to store data to generate a delay control signal to adjust an amount of delay for multiple delay devices of N-phase generators 1661.

Peripheral devices 1669 may include displays, imaging devices, printing devices, wireless devices, additional storage memory, and control devices that may operate in conjunction with controller 1662. In various embodiments, system 1600 includes, but is not limited to, fiber optic systems or devices, electro-optic systems or devices, optical systems or devices, imaging systems or devices, and information handling systems or devices such as wireless systems or devices, telecommunication systems or devices, and computers.

Figure 17:
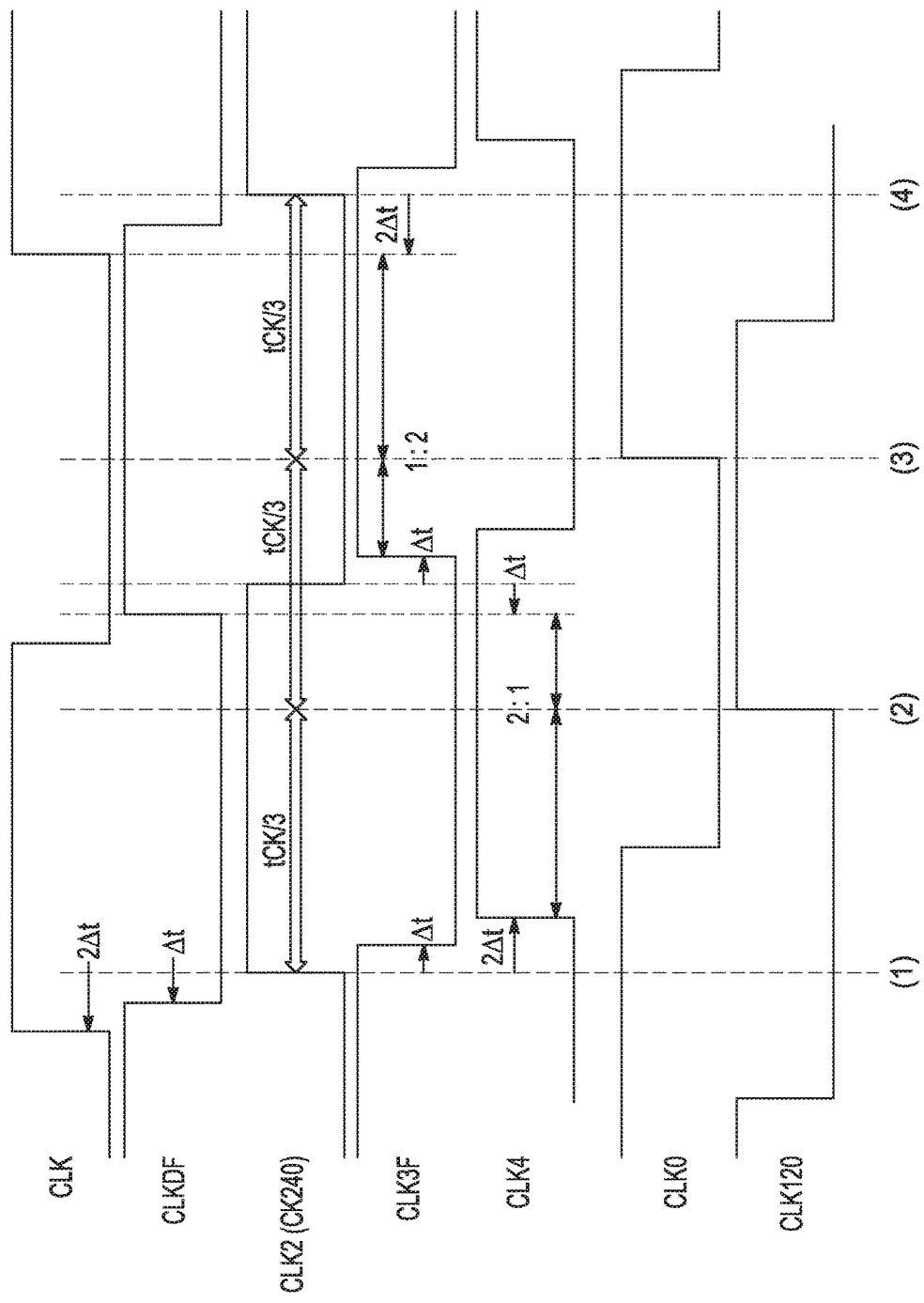
FIG. 17 is an illustration of exemplary waveforms from operating the example triple-phase generator of FIG. 1.

FIG. 17 is an illustration of exemplary waveforms from operating the example triple-phase generator 102 of FIG. 1. It is assumed that each of the first to fourth delay devices is an inverter and Δtp of the fifth delay device 106 and the phase mixers 105-1 and 105-2 is zero.

Each of the inverters 104-1, 140-2, 104-2 and 104-4 outputs the respective waveforms CLKDF, CK2, CLK3F and CK4 as illustrated in the FIG. 17. As illustrated, the CLK and CLKDF advance by 2Δt and Δt respectively from the CLK2 (timing (1)). On the contrary, the CLK3F and CLK 4 retard by Δt and 2Δt respectively from the CLK2 (timing (1)). That is, the clocks are divided into a group of the CLK and CLKDF as advancing side and a group of the CLK3F and the CLK4 as retarding side, centering on the CLK2 (CK240).

The phase mixer 105-1 receives the CLK3F at the node A and the CLK at the node B. The phase mixer 105-1 provides the CK0 having a rising edge rising at a timing (3) obtained by partitioning by 1:2 a period defined by rising edges of the CLK3F and CLK. On the contrary, the phase mixer 105-2 receives the CLKDF at the node A and the CLK4 at the node B. The phase mixer 105-2 provides the CK120 having a rising edge rising at a timing (2) obtained by partitioning by 1:2 a period defined by rising edges of the CLKDF and CLK4.

The CLK240 has one clock cycle defined by the timings (1) and (4). The rising edge of the CLK0 and the CLK120 are substantially aligned such that the one cycle of the CLK240 are substantially trisected. That is, each of the period between the timings (1) and (2), the period between the timings (2) and (3) and the period between the timing (3) and (4) is substantially tCK/3.

In case that each of circuits 106, 105-1 and 105-2 outputs the respective clocks with a delay Δt, the relationship of the CLK0. CLK120 and CLK240 are not unchanged in phase.

The architecture of delay devices and phase mixers, as taught herein, provide a mechanism to avoid constructing stabilization of feedback circuits for multiple phase generation and can result in instant-on capability. In addition, such architectures allow for generation of signals of N phases without dividing an input clock signal from which the N phases are generated.

Although specific embodiments have been illustrated and described herein, it will be appreciated by those of ordinary skill in the art that other arrangements derived from the teachings herein may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. An apparatus comprising:
    a phase generator structured to generate and output a set of N clock signals with N being a positive integer, each clock signal being separated in phase from another clock signal of the set of N clock signals by 360/N degrees, the phase generator including:
        a clock input to receive an input clock signal;
        multiple delay devices coupled together, a delay device of the multiple delay devices coupled to the clock input to receive the input clock signal; and
        a set of phase mixers, each phase mixer having a mixing ratio of 1 to (N−1), one phase mixer having inputs to receive the input clock signal and a delayed input clock signal from an output of a delay device of the multiple delay devices, and each of the other phase mixers having inputs coupled to receive different delayed input clock signals from outputs of different ones of the multiple delay devices, coupling of the phase mixers to outputs of the multiple delay devices based on the mixing ratio and a phase of the N clock signal operatively output from the respective phase mixer.

2. The apparatus of claim 1, wherein the multiple delay devices include a number of the multiple delay devices providing a common amount of delay and one delay device of the multiple delay devices providing an amount of delay equal to a common amount of delay of the phase mixers.

3. The apparatus of claim 2, wherein the clock signal having a phase of (N−1)*360/N is operatively output from the delay device providing the amount of delay equal to the common amount of delay of the phase mixers.

4. The apparatus of claim 1, wherein the multiple delay devices include a number of the multiple delay devices providing a common amount of delay that is greater than or equal to one-fifth of a minimum period of the input clock signal and less than the minimum period of the input clock signal.

5. The apparatus of claim 1, wherein N=3.

6. The apparatus of claim 1, wherein the apparatus includes delay control circuitry to provide a delay control signal to adjust an amount of delay that is common to each of a number of the multiple delay devices and/or to provide a delay control signal to adjust an amount of delay that is common to each of the phase mixers, the amount of delay adjusted adaptively based on a frequency range of the input clock signal.

7. The apparatus of claim 6, wherein the delay control circuitry includes frequency detection to identify a frequency of the input clock signal as being in one of three frequency ranges and generate the delay control signal based on the identified frequency.

8. The apparatus of claim 6, wherein the delay control circuitry includes a mode register to store data to generate the delay control signal.

9. The apparatus of claim 6, wherein the delay control signal is a digital signal.

10. The apparatus of claim 6, wherein the delay control signal is an analog signal.

11. The apparatus of claim 1, wherein the phase generator is integrated in a processor integrated circuit.

12. The apparatus of claim 1, wherein the phase generator is integrated in a memory integrated circuit.

13. A N-phase generator comprising:
    a clock input to receive an input clock signal having a period;
    N outputs to provide N clock signals with N being a positive integer, each clock signal of the N clock signals being separated in phase from another clock signal of the set of N clock signals by 360/N degrees, each of the N clock signals having a period equal to the period of the input clock signal;
    multiple delay devices coupled together, a delay device of the multiple delay devices coupled to the clock input to receive the input clock signal; and
    a set of phase mixers, each phase mixer having a mixing ratio of 1 to (N−1), one phase mixer having inputs to receive the input clock signal and a delayed input clock signal from an output of a delay device of the multiple delay devices, and each of the other phase mixers having inputs coupled to receive different delayed input clock signals from outputs of different ones of the multiple delay devices, coupling of the phase mixers to outputs of the multiple delay devices based on the mixing ratio and a phase of the N clock signals operatively output from the respective phase mixer.

14. The N-phase generator of claim 13, wherein the multiple delay devices include a number of the multiple delay devices providing a common amount of delay that is greater than or equal to one-fifth of a minimum period of the input clock signal and less than the minimum period of the input clock signal.

15. The N-phase generator of claim 13, wherein
    N equals 3;
    the multiple delay devices include a first delay device, a second delay device, a third device delay, and a fourth delay device in a serial chain from the first delay device coupled to the input clock signal with the fourth delay device at the end of the serial chain, each of the first, second, third, and fourth delay device providing a same amount of delay;

a first phase mixer of the set of phase mixers having a mixing ratio of 1:2 and being the phase mixer having the input to receive the input clock signal from the clock input, the first phase mixer having an input coupled to an output of the third delay device of the serial chain and having an output to provide a clock of zero phase of the N clock signals, the input to receive the input clock signal being the input of the first phase mixer correlated to 2 in the mixing ratio;

a second phase mixer of the set of phase mixers having a mixing ratio of 1:2 having an input coupled to an output of the first delay device of the serial chain and an input coupled to an output of the fourth delay device of the serial chain, and having an output to provide a clock of 120 degree phase of the N clock signals, the input coupled to the output of the fourth delay device being the input of the second phase mixer correlated to 2 in the mixing ratio; and a fifth delay device of the multiple delay devices providing an amount of delay equal to a common amount of delay of the first and second phase mixers, the fifth delay device having an input coupled to an output of the second delay device of the serial chain and having an output to provide a clock of 240 degree phase of the N clock signals.

16. The N-phase generator of claim 13, wherein the multiple delay devices are inverters.

17. A method comprising:
receiving an input clock signal at a clock input, the input clock signal having a period;
inputting the input clock signal to a serial chain of multiple delay devices coupled together, a first delay device of the multiple delay devices to receive the input clock signal;
distributing the input clock signal and outputs of a number of the multiple delay devices to a set of phase mixers based on a mixing ratio of the phase mixers of the set of phase mixers, each phase mixer having a mixing ratio of 1 to (N−1) with N being a positive integer equal to or greater than three; and
outputting N clock signals, each clock signal of the N clock signals being separated in phase from another clock signal of the set of N clock signals by 360/N degrees, each of the N clock signals having a period equal to the period of the input clock signal, a number of the N clock signals provided from outputs of the set of phase mixers.

18. The method of claim 17, wherein N=3.

19. The method of claim 17, wherein the method includes providing a delay control signal to adjust an amount of delay that is common to each of a number of the multiple delay devices and/or providing a delay control signal to adjust an amount of delay that is common to each of the phase mixers, the amount of delay adjusted adaptively based on a frequency range of the input clock signal.

20. The method of claim 17, wherein providing the delay control signal includes providing an analog control signal.

21. The method of claim 17, wherein providing the delay control signal includes providing a digital control signal.

22. A phase generator comprising:
first to fifth nodes;
a first delay device having an input coupled to the first node and an output coupled to the second node;
a second delay device having an input coupled to the second node and an output coupled to the third node;
a third delay device having an input coupled to the third node and an output coupled to the fourth node;
a fourth delay device having an input coupled to the fourth node and an output coupled to the fifth node;
a first phase mixer comprising a first input coupled to the fourth node and a second input coupled to the first node to output a first clock signal; and
a second phase mixer comprising a first input coupled to the second node and a second input coupled to the fifth node to output a second clock signal.

23. The phase generator of claim 22, wherein each of the phase mixer has a mixing ratio of 1:2.

24. The phase generator of claim 23, wherein each of the first to fourth delay devices is an inverter.

25. The phase generator of claim 24, wherein each of the first to fourth delay devices has a first delay.

26. The phase generator of claim 25, wherein each of first and second phase mixers has a second delay.

27. The phase generator of claim 26, further comprising a fifth delay device comprising an input coupled to the third node to output a third clock signal, the fifth delay device having the second delay.

* * * * *